United States Patent
Griebenow et al.

(10) Patent No.: US 8,338,894 B2
(45) Date of Patent: Dec. 25, 2012

(54) INCREASED DEPTH OF DRAIN AND SOURCE REGIONS IN COMPLEMENTARY TRANSISTORS BY FORMING A DEEP DRAIN AND SOURCE REGION PRIOR TO A CAVITY ETCH

(75) Inventors: Uwe Griebenow, Markkleeberg (DE); Jan Hoentschel, Dresden (DE); Sven Beyer, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 215 days.

(21) Appl. No.: 12/693,692

(22) Filed: Jan. 26, 2010

(65) Prior Publication Data

US 2010/0193873 A1    Aug. 5, 2010

(30) Foreign Application Priority Data

Jan. 30, 2009  (DE) .......................... 10 2009 006 800

(51) Int. Cl.
*H01L 27/092* (2006.01)
*H01L 21/8238* (2006.01)
(52) U.S. Cl. ................. 257/369; 257/351; 257/E21.634; 257/E27.062; 438/222
(58) Field of Classification Search .................. None
See application file for complete search history.

(56) References Cited

U.S. PATENT DOCUMENTS

| | | | |
|---|---|---|---|
| 6,165,826 A | 12/2000 | Chau et al. | 438/231 |
| 6,348,390 B1 * | 2/2002 | Wu | 438/305 |
| 6,420,218 B1 * | 7/2002 | Yu | 438/142 |
| 6,506,654 B1 * | 1/2003 | Wei et al. | 438/307 |
| 6,780,686 B2 * | 8/2004 | Wei et al. | 438/146 |
| 6,872,626 B1 * | 3/2005 | Cheng | 438/299 |
| 7,247,535 B2 * | 7/2007 | Jain | 438/233 |
| 2004/0169227 A1 * | 9/2004 | Wei et al. | 257/347 |
| 2006/0118878 A1 * | 6/2006 | Huang et al. | 257/369 |
| 2007/0066001 A1 * | 3/2007 | Iinuma | 438/199 |
| 2007/0231983 A1 * | 10/2007 | Shifren et al. | 438/197 |
| 2007/0252204 A1 * | 11/2007 | Wei et al. | 257/347 |
| 2007/0254441 A1 * | 11/2007 | Wei et al. | 438/299 |
| 2008/0090349 A1 * | 4/2008 | Hoentschel et al. | 438/229 |
| 2008/0090368 A1 * | 4/2008 | Fisher et al. | 438/303 |
| 2008/0179628 A1 * | 7/2008 | Wei et al. | 257/190 |
| 2008/0258233 A1 * | 10/2008 | Hsiao et al. | 257/382 |
| 2008/0265256 A1 * | 10/2008 | Lin et al. | 257/70 |

(Continued)

OTHER PUBLICATIONS

Tsao, J.Y., D.J. Ehrlich, D.J. Silversmith, and R.W. Mountain. "Direct-write Metallization of Silicon MOSFET's Using Laser Photodeposition." IEEE Electron Device Letters 3.6 (1982): 164-66.*

(Continued)

*Primary Examiner* — Thomas L Dickey
*Assistant Examiner* — Joseph Schoenholtz
(74) *Attorney, Agent, or Firm* — Williams, Morgan & Amerson

(57) ABSTRACT

Deep drain and source regions of an N-channel transistor may be formed through corresponding cavities, which may be formed together with cavities of a P-channel transistor, wherein the lateral offsets of the cavities may be adjusted on the basis of an appropriate reverse spacer regime. Consequently, the dopant species in the N-channel transistor extends down to a specific depth, for instance down to the buried insulating layer of an SOI device, while at the same time providing an efficient strain-inducing mechanism for the P-channel transistor with a highly efficient overall manufacturing process flow.

19 Claims, 9 Drawing Sheets

U.S. PATENT DOCUMENTS

2009/0191679 A1* 7/2009 Ouyang et al. ............... 438/276
2009/0246927 A1* 10/2009 Wiatr et al. ................... 438/305

OTHER PUBLICATIONS

Borland, John. "Meeting Challenges Engineering for the Gate State." Solid State Technology (Jul. 2005).*

Loo, R., P. Verheyen, G. Eneman, R. Rooyackers, F. Leys, D. Shamiryan, K. Meyer, P. Absil, and M. Caymax. "Characteristics of Selective Epitaxial SiGe Deposition Processes for Recessed Source/drain Applications." Thin Solid Films 508.1-2 (2006): 266-69.*

Abdolahad, M., J. Naghsh Nilchi, and S. Mohajerzadeh. "Fluorine-free High-resolution Selective Plasma Etching of Silicon-oxide Layers on Silicon Substrates." Journal of Physics D: Applied Physics 43.39 (2010): 395402.*

Allen, Lynn R. "Selective Dry Etching of Oxide Films for Spacer Applications in a High Density Plasma." J. Vac. Sci. Technol. B 6th ser. 14 (1996): 3470-472.*

Kastenmeier, B. "Chemical Dry Etching of Silicon Nitride and Silicon Dioxide Using CF4/O2/N2 Gas Mixtures." J. Vac. Sci. Technol. A 5th ser. 14 (1996): 2802-813.*

Krzeminski, Christophe. "Stress Mapping in Strain-engineered Silicon P-type MOSFET Device:A Comparison between Process Simulation and Experiments." J. Vac. Sci. Technol. B 2nd ser. 30 (2012): 002203-1-2203-8.*

Flachowsky, Stefan, Ralf Illgen, Tom Herrmann, Wilfried Klix, Roland Stenzel, Ina Ostermay, Andreas Naumann, Andy Wei, Jan Höntschel, and Manfred Horstmann. "Detailed Simulation Study of Embedded SiGe and Si:C Source/drain Stressors in Nanoscaled Silicon on Insulator Metal Oxide Semiconductor Field Effect Transistors." Journal of Vacuum Science &.*

Fukumoto, Hiroshi, Isao Fujikake, Yoshinori Takao, Koji Eriguchi, and Kouichi Ono. "Plasma Chemical Behaviour of Reactants and Reaction Products during Inductively Coupled CFplasma Etching of SiO." Plasma Sources Science and Technology 18.4 (2009): 045027.*

Illgen, Ralf, Stefan Flachowsky, Tom Herrmann, Wilfried Klix, Roland Stenzel, Thomas Feudel, Jan Höntschel, and Manfred Horstmann. "Effect of Source/drain-extension Dopant Species on Device Performance of Embedded SiGe Strained P-metal Oxide Semiconductor Field Effect Transistors Using Millisecond Annealing." Journal of Vacuum Science & Technology.*

Regis, J. M. "Reactive Ion Etch or Silicon Nitride Spacer with High Selectivity to Oxide." IEEE/SEMI Advanced Semiconductor Manufacturing Conference (1997): 252-56.*

Thompson, S.E., Guangyu Sun, Youn Sung Choi, and T. Nishida. "Uniaxial-process-induced Strained-Si: Extending the CMOS Roadmap." IEEE Transactions on Electron Devices 53.5 (2006): 1010-020.*

Van Zeghbroeck, B. "Principles of Semiconductor Devices." (2011).*

Translation of Official Communication from German Patent Office for German Patent Application No. 10 2009 006 800.7 dated Nov. 24, 2009.

* cited by examiner

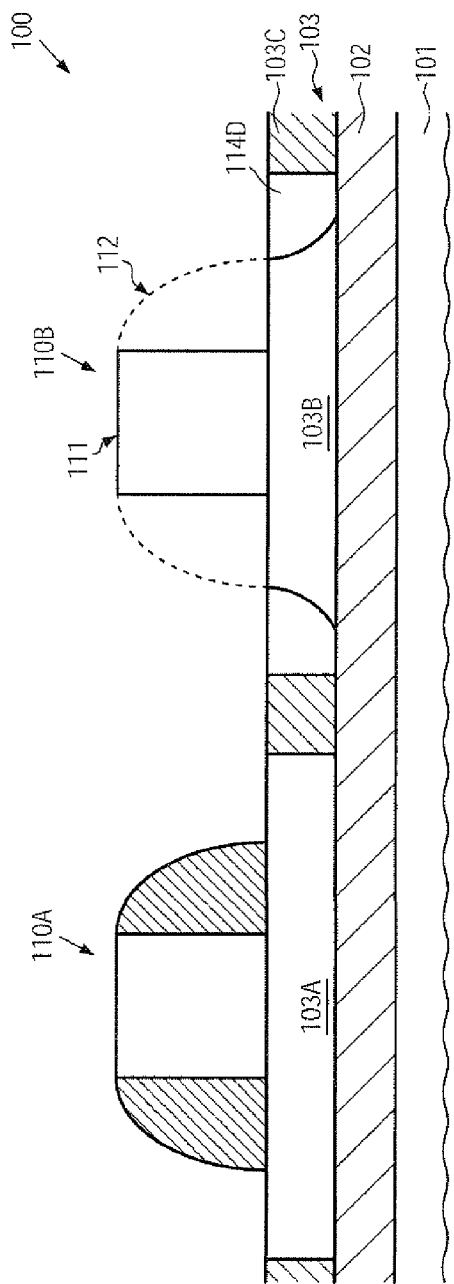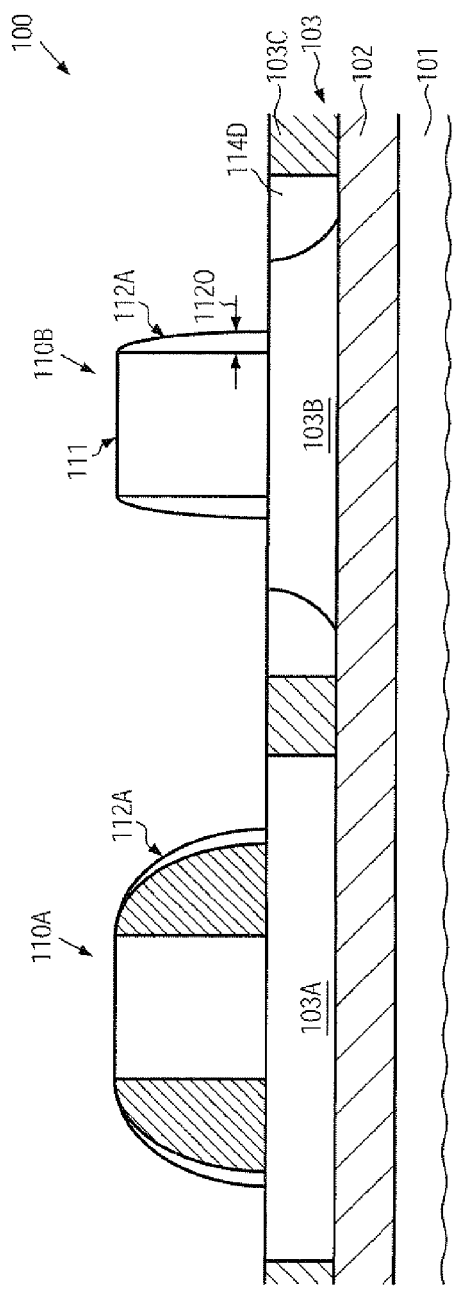

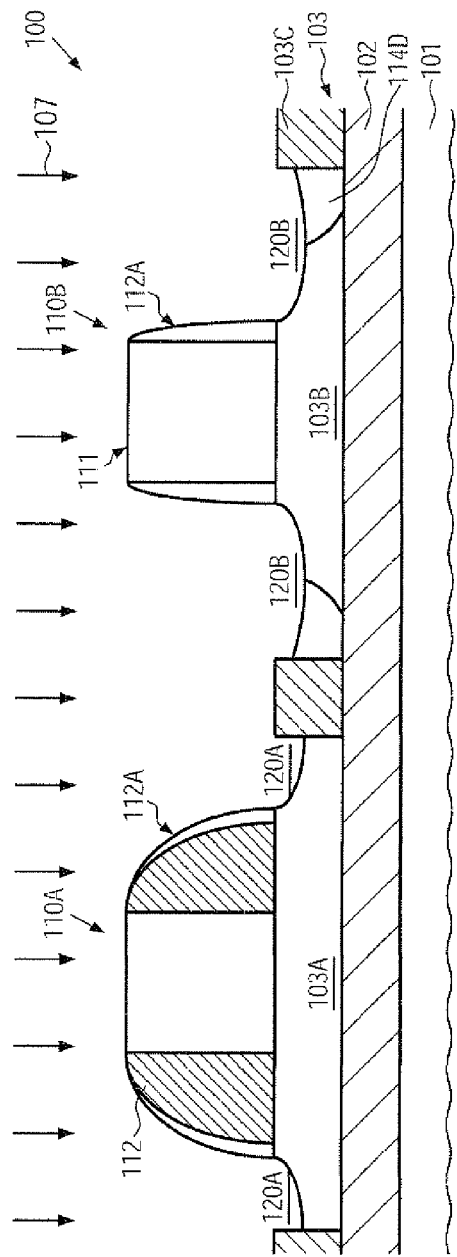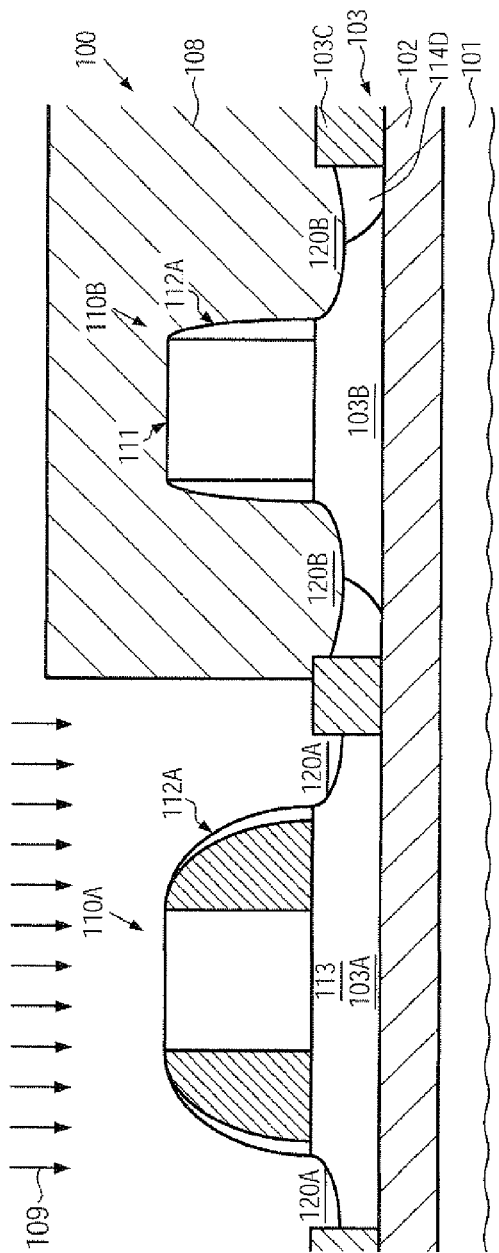

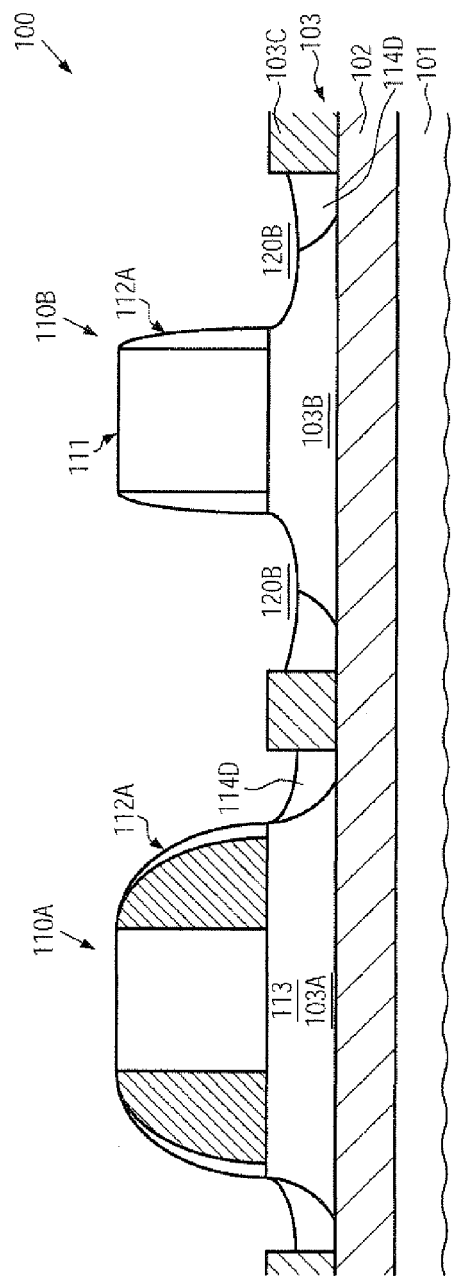
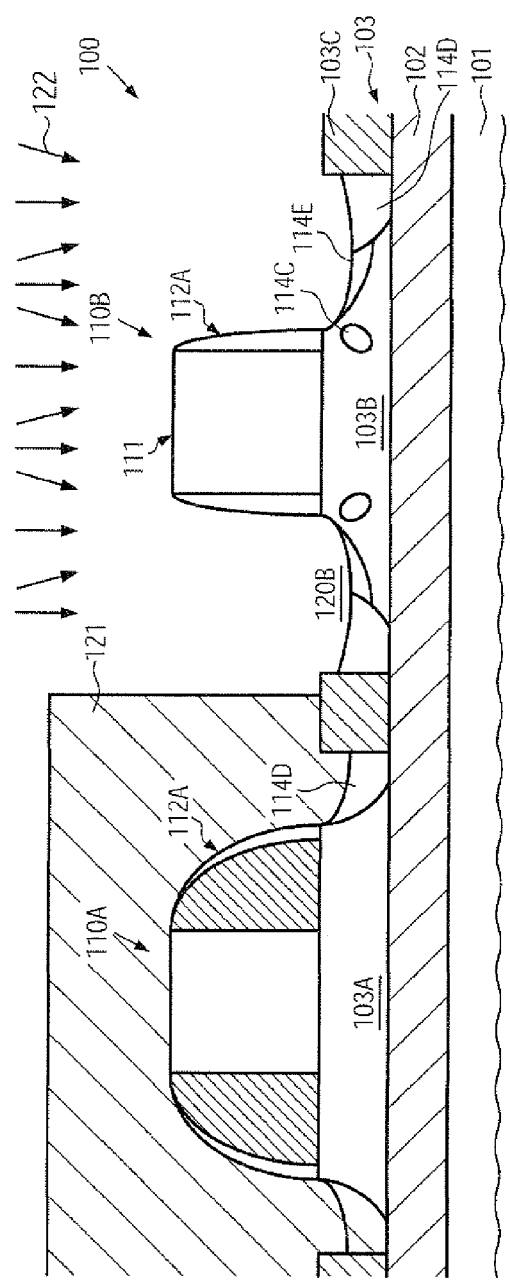

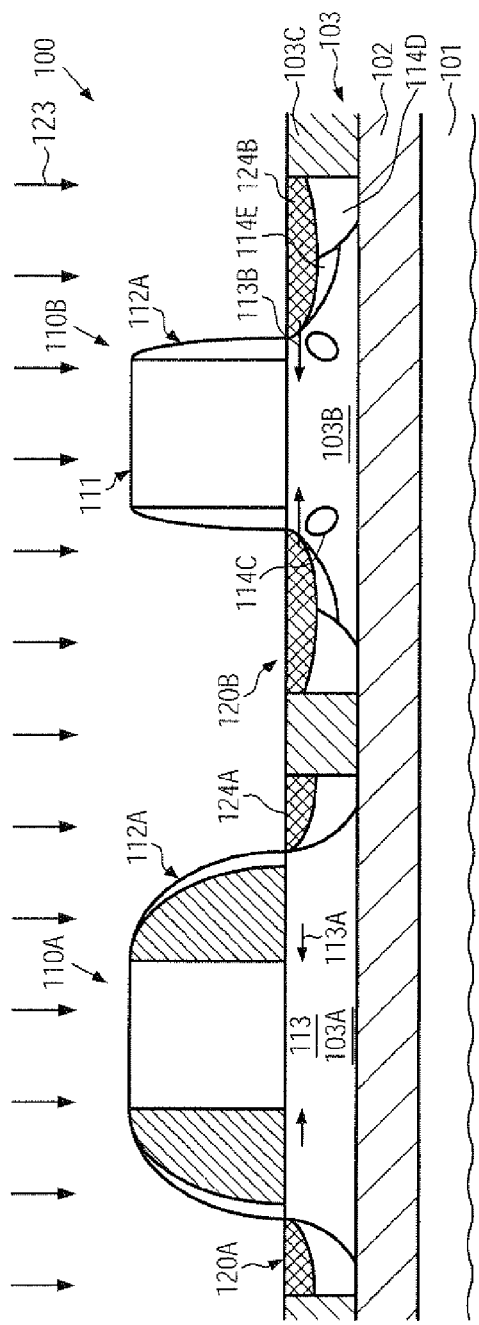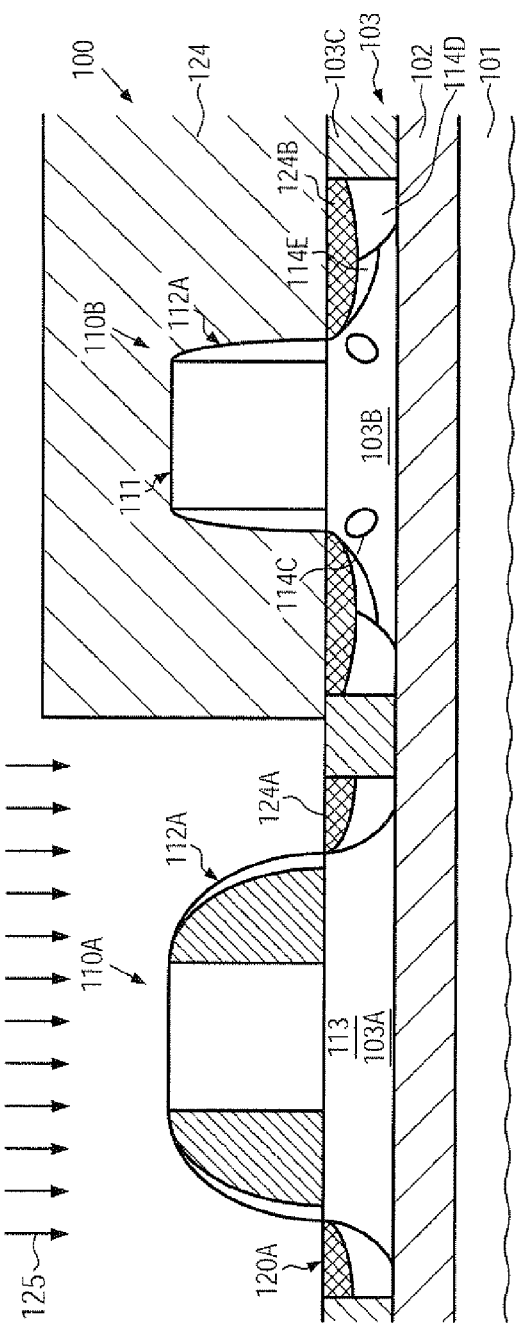
FIG. 1k
FIG. 1l

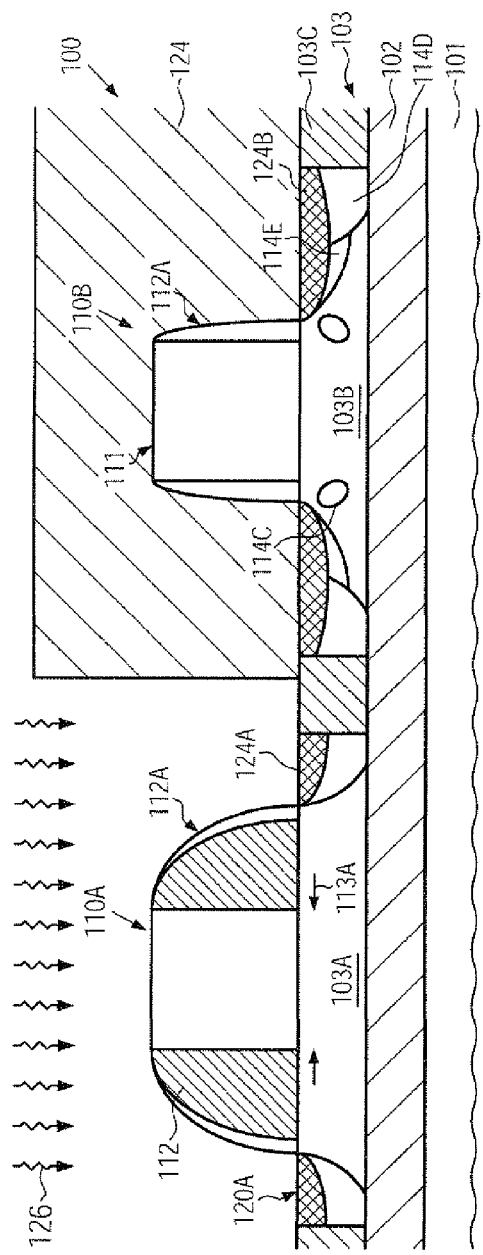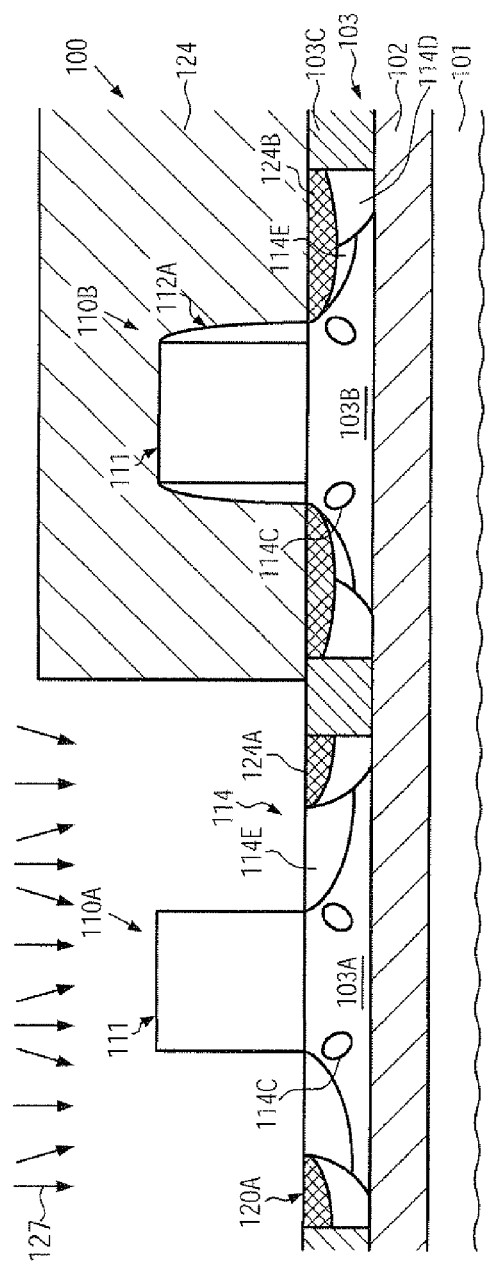

INCREASED DEPTH OF DRAIN AND SOURCE REGIONS IN COMPLEMENTARY TRANSISTORS BY FORMING A DEEP DRAIN AND SOURCE REGION PRIOR TO A CAVITY ETCH

BACKGROUND OF THE INVENTION

1. Field of the Invention

The present disclosure generally relates to the fabrication of integrated circuits, and, more particularly, to the fabrication of highly sophisticated field effect transistors, such as MOS transistor structures having a gate electrode with a gate height inducing a reduced ion blocking capability.

2. Description of the Related Art

The manufacturing process for integrated circuits continues to improve in several ways, driven by the ongoing efforts to scale down the feature sizes of the individual circuit elements. Presently, and in the foreseeable future, the majority of integrated circuits is, and will be, based on silicon devices due to the high availability of silicon substrates and due to the well-established process technology that has been developed over the past decades. A key issue in developing integrated circuits of increased packing density and enhanced performance is the scaling of transistor elements, such as MOS transistor elements, to provide the great number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length is necessary for obtaining smaller and faster transistor elements, it turns out, however, that a plurality of issues are additionally involved to maintain proper transistor performance for a reduced gate length. One challenging task in this respect is the provision of shallow junction regions, at least at the area in the vicinity of the channel region, i.e., source and drain extension regions, which nevertheless exhibit a high conductivity so as to minimize the resistivity in conducting charge carriers from the channel to a respective contact area of the drain and source regions. The requirement for shallow junctions having a high conductivity is commonly met by performing an ion implantation sequence to obtain a high dopant concentration having a profile that varies laterally and in depth. The introduction of a high dose of dopants into a crystalline substrate area, however, generates heavy damage in the crystal structure and, therefore, one or more anneal cycles are typically required for activating the dopants, i.e., for placing the dopants at crystal sites, and to cure the heavy crystal damage. However, the electrically effective dopant concentration is limited by the ability of the anneal cycles to electrically activate the dopants. This ability in turn is limited by the solid solubility of the dopants in the silicon crystal and the temperature and duration of the anneal process that are compatible with the process requirements. Moreover, besides the dopant activation and the curing of crystal damage, dopant diffusion may also occur during the annealing, which may lead to a "blurring" of the dopant profile. A defined degree of blurring may be advantageous for defining critical transistor properties, such as the overlap between the extension regions and the gate electrode.

In other areas of the drain and source regions, that is, in deeper lying portions, the diffusion may result in a reduction of the dopant concentration at the corresponding PN junction areas, thereby reducing the conductivity at the vicinity of theses areas. Thus, on the one hand, a high anneal temperature may be desirable in view of a high degree of dopant activation, re-crystallization of implantation-induced lattice damage and a desired diffusion at shallow areas of the extension regions, while, on the other hand, the duration of the anneal process should be short in order to restrict the degree of dopant diffusion in the deeper drain and source regions, which may reduce the dopant gradient at the respective PN junctions and also reduce the overall conductivity due to reducing the average dopant concentration. Therefore, for highly advanced transistors, the positioning, shaping and maintaining of a desired dopant profile are important properties for defining the final performance of the device, since the overall series resistance of the conductive path between the drain and source contacts may represent a dominant part for determining the transistor performance.

A further issue related to the lateral and vertical dopant profile of the drain and source regions and thus of the PN junctions may be presented by the overall capacitance of the PN junctions, which is roughly related to the effective interface formed by the PN junctions with respect to the remaining active region of the semiconductor device. In order to further enhance the performance of silicon-on-insulator (SOI) transistors, the parasitic capacitance of the PN junctions may be significantly reduced by designing the vertical dopant profile in such a manner that a high dopant concentration is obtained that extends down to the buried insulating layer. In this way, only the laterally oriented interfaces, i.e., the PN junction of the drain and source regions contribute to the overall junction capacitance, while additionally the high dopant concentration extending down to the buried insulating layer provides the desired PN junction characteristics and also a reduced overall series resistance in the drain and source regions. However, providing deep drain and source regions with high dopant concentrations down to the buried insulating layer may require sophisticated implantation techniques, thereby contributing to the overall process complexity. In other cases, a moderately high dopant concentration at the buried insulating layer may be accomplished by adjusting the process parameters of the respective anneal processes in such a way that the diffusion of the dopants during the anneal process may result in the desired vertical dopant profile. The respective anneal parameters may not, however, be compatible with the requirement of a reduced transistor length, since a lateral diffusion, for instance in the extension regions, may also take place and result in a modified channel length, which may, therefore, require increased spacer widths to accommodate the increased diffusion activity during a respective anneal process. Thus, high temperature anneal processes with extended process times for inducing high diffusion activity and thus generating a high thermal budget may be a less attractive approach in view of increasing the packing density of sophisticated semiconductor devices.

Moreover, techniques have recently been developed in which the transistor performance, for instance the performance of P-channel transistors, may be significantly enhanced by providing a strained semiconductor material, such as a silicon/germanium compound, which may be formed in drain and source regions of silicon-based active transistor areas. The strained silicon/germanium compound, which may also be referred to as a silicon/germanium alloy, may be provided in a strained state due to a mismatch of the lattice spacing between natural silicon and natural silicon/ germanium alloy. That is, the silicon/germanium material may be formed on the basis of the silicon lattice spacing, thereby resulting in a strained silicon/germanium crystal lattice, which may then interact with the neighboring semiconductor material to exert a stress and thus cause a certain strain. When providing the strained silicon/germanium alloy in the drain and source regions, the respective stress created by the strained material may act on the channel region of the transistor, thereby creating a respective compressive strain therein, which may enhance the charge carrier mobility therein. In highly scaled transistor devices based on the SOI architecture, significant benefits with respect to performance may be achieved by providing a highly strained semiconductor alloy in the vicinity of the channel region that extends along a significant portion in the depth direction in the semiconductor layer. Consequently, an efficient strain-inducing mechanism in SOI devices in combination with a reduced parasitic junction capacitance may result in an overall performance gain, while additionally a highly reduced thermal budget of the respective anneal processes may be desirable so as to provide the potential for reducing the lateral dimensions of the transistor devices, as explained above.

However, during further device scaling, for instance in the 45 nm MOSFET technology, the implant energy for forming the deep drain and source regions of SOI devices and of bulk devices is substantially limited by the ion blocking capability of the gate electrode since the thickness of the semiconductor layer and thus of the deep drain and source regions is comparable to the height of the gate electrode. Consequently, if a desired high dopant concentration is to be incorporated at a desired depth, for instance at the interface between the active semiconductor layer and the buried insulating layer in an SOI configuration, without using significant dopant diffusion, which may result in a reduced dopant concentration, as previously discussed, the channel region located below the gate electrode may also receive the dopant species, thereby significantly altering the transistor performance. That is, if the implant energy is selected moderately high, as is, in particular, required for the NMOS transistor due to the nature of the N-type dopant species and the diffusion behavior thereof, so as to position the dopant species at a desired depth, for instance close to the silicon/silicon dioxide interface of an SOI NMOS transistor, the polysilicon gate electrode may not efficiently block the implant species, thereby resulting in an undesired doping of the channel region and/or degradation of the thin gate dielectric material. On the other hand, adjusting the implant energy with respect to the ion blocking capability of the gate electrode may result in a reduced depth of the deep drain and source areas of the NMOS transistor, which may result in SOI techniques in increased junction capacitance, which may also translate into a reduced transistor performance. A reduced gate height, however, may be highly desirable in view of other transistor characteristics, such as lowering the fringing capacitance of the gate electrode, reducing the aspect ratio caused by the device topography in densely packed device regions after completing the basis transistor structures which may result in deposition-related non-uniformities during the deposition of the interlayer dielectric material and the patterning thereof and the like.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and semiconductor devices for forming deep drain and source regions, in particular in N-channel transistors for a given electrode height, by appropriately recessing a portion of the drain and source area of the N-channel transistor and the P-channel transistor on the basis of a highly efficient process flow. According to some illustrative embodiments, forming corresponding cavities for both types of transistors may be accomplished in a common etch process, while nevertheless providing different lateral offsets of the cavities in the N-channel transistor and P-channel transistor, respectively. In this manner, a performance increasing mechanism in the form of a strain-inducing semiconductor material may be applied in the P-channel transistor while at the same time providing enhanced conditions for forming deep drain and source regions of the N-channel transistor, which may be accomplished through the corresponding cavities having a desired high offset with respect to the gate electrode of the N-channel transistor. In some illustrative embodiments disclosed herein, the different offset may be obtained on the basis of an appropriate masking regime using sidewall spacer elements that may be selectively reduced in size prior to performing the cavity etch process. Consequently, the effective penetration depth of the dopant species for the N-channel transistor may be increased on the basis of an appropriately set gate height, wherein additionally enhanced process conditions may be provided during the cavity etch process and the subsequent epitaxial growth of a strain-inducing semiconductor alloy due to a reduced degree of "pattern loading."

One illustrative method disclosed herein comprises masking a first semiconductor region of a first transistor having formed thereon a first gate electrode structure that comprises a first sidewall spacer structure. Furthermore, a second semiconductor region of a second transistor having formed thereon a second gate electrode structure that comprises a second sidewall spacer structure is exposed. Moreover, the method comprises forming deep drain and source regions in the second semiconductor region by using the second gate electrode structure as an implantation mask. Additionally, at least a portion of the second sidewall spacer structure is removed and first cavities are formed in the first semiconductor region on the basis of the first sidewall spacer structure and second cavities are formed in the second semiconductor region after removing at least the portion of the second sidewall spacer structure. Additionally, deep drain and source regions are formed in the first cavities and drain and source extension regions are formed in the second semiconductor region. Finally, a strain-inducing semiconductor material is formed in the first and second cavities.

A further illustrative method disclosed herein comprise forming first cavities in a first semiconductor region of a first transistor and forming second cavities in a second semiconductor region of a second transistor, wherein the second semiconductor region comprises deep drain and source regions of the second transistor. The method further comprises forming deep drain and source regions of the first transistor through the first cavities and forming a strain-inducing semiconductor material in the first and second cavities. Additionally, drain and source extension regions of the first transistor are formed and drain and source extension regions of the second transistor are formed.

One illustrative semiconductor device disclosed herein comprises an N-channel transistor comprising a first gate electrode material formed above a first semiconductor region that comprises a first locally restricted portion of a semiconductor alloy, wherein the first portion has a first offset from the first gate electrode material. The semiconductor device further comprises a P-channel transistor comprising a second gate electrode material formed above a second semiconductor region that comprises a second locally restricted portion of the semiconductor alloy, wherein the second portion has a second offset from the second gate electrode material and wherein the second offset is less than the first offset.

BRIEF DESCRIPTION OF THE DRAWINGS

The disclosure may be understood by reference to the following description taken in conjunction with the accompanying drawings, in which like reference numerals identify like elements, and in which.

Figure 1A:
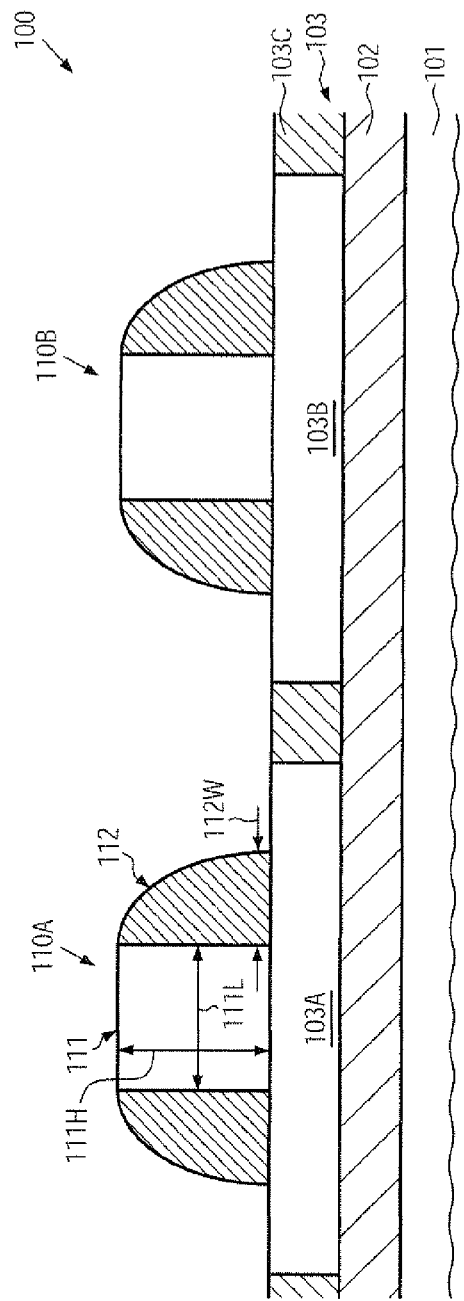
FIGS. 1a-1o schematically illustrate cross-sectional views of a semiconductor device comprising an N-channel transistor and a P-channel transistor during various manufacturing stages in which effective penetration depth of an N-channel transistor may be increased while at the same time providing a strain-inducing semiconductor material in the P-channel transistor, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure addresses the problem of a reduced ion blocking capability of gate electrode structures in sophisticated transistor devices, at least for one type of transistor, when a reduced gate height may be desirable in view of reducing the fringing capacitance of the gate electrode, reducing the surface topography after providing the gate electrode structure and the like. As previously discussed, in particular, SOI transistors may suffer from a significant reduction of performance when a desired high dopant concentration may not be positioned at the interface between the active semiconductor layer and the buried insulating layer, since this may result in increased junction capacitance. Consequently, by recessing the drain and source areas, at least for one type of transistor, the ion blocking capability may be effectively enhanced since significantly reduced implantation energies may be applied while nevertheless appropriately positioning the dopant species so as to extend down to the buried insulating layer. At the same time, a corresponding etch process for forming cavities in the transistor elements may be performed on the basis of enhanced overall process conditions, since the cavities may be formed on both types of transistors, thereby achieving an enhanced degree of uniformity of the patterning process. In order to provide the desired reduced offset of one type of cavity with respect to the gate electrode material, an appropriate masking regime, for instance on the basis of the sidewall spacer structure, may be applied prior to performing the patterning sequence. Consequently, the strain-inducing semiconductor alloy, such as a silicon/germanium alloy and the like, may be positioned close to the channel region, whereas the corresponding semiconductor alloy may be positioned with an increased offset in the other type of transistor, thereby reducing any negative effect on the performance of this transistor. In other illustrative embodiments, the per se advantageous electronic characteristics of the silicon/germanium material may be taken advantage of in the N-channel transistor without creating a corresponding compressive strain component, which may be accomplished by performing a relaxation implantation process, which may be performed at any appropriate manufacturing stage, i.e., prior to the removal of the corresponding spacer structure or after the removal thereof, thereby also obtaining a certain degree of amorphization of drain and source areas, in which drain and source extension regions have to be formed in a subsequent implantation process. Thus, in some illustrative embodiments disclosed herein, a "reverse spacer" regime may be applied to form deep drain and source regions of one type of transistor and also for basically defining a lateral offset of a cavity formed in the other type of transistor, which may thus be advantageously used for enhancing penetration depth of the corresponding dopant species. Thereafter, the spacer structure may be selectively patterned to obtain the desired offset for cavities as required for achieving a desired high strain-inducing effect. Thereafter, the cavity formed in the N-channel transistor may be efficiently used for incorporating the dopant species at a reduced implantation energy, while the subsequently formed semiconductor alloy may contribute to a reduced drain/source resistance due to the electronic characteristics of the semiconductor alloy.

It should be appreciated that the present disclosure may be advantageously applied to SOI devices due to the above-discussed reasons in view of reducing junction capacitance. On the other hand, the principles disclosed herein may also be applied to a bulk architecture when generally reduced implantation energies are to be used due to a reduced gate height. Thus, unless specifically set forth in the appended claims or in certain embodiments described herein, the present disclosure should not be considered as being restricted to a specific transistor architecture.

FIG. 1a schematically illustrates a cross-sectional view of a semiconductor device 100 which may comprise a substrate 101 and a semiconductor layer 103. Furthermore, in the embodiment shown, a buried insulating layer 102, for instance comprised of any appropriate insulating material, may be positioned between the substrate 101 and the semiconductor layer 103, thereby providing an SOI configuration. As previously discussed, in other illustrative embodiments (not shown), the buried insulating layer 102 may, at least locally within the semiconductor device 100, not be provided, thereby defining a bulk architecture, i.e., a device architecture, in which the crystalline semiconductor material of the layer 103 may extend into the substrate 101. The semiconductor layer 103 may have any appropriate composition and thickness as may be required by design rules and transistor characteristics for forming a first transistor 110A and a second transistor 110B. For example, the semiconductor layer 103 may comprise a significant amount of silicon material, wherein the characteristics thereof, for instance with respect to charge carrier mobility, may have to be modified on the basis of an induced strain, as previously discussed. The semiconductor layer 103 may comprise a plurality of isolation structures 103C, which may laterally delineate corresponding active regions 103A, 103B for the transistors 110A, 110B, respectively. It should be appreciated that the active regions 103A, 103B may not necessarily be positioned laterally adjacent to each other and also one or both of the active regions 103A, 103B may be appropriately dimensioned to accommodate two or more individual transistor elements. In the manufacturing stage shown, each of the transistor 110A, 110B may comprise a gate electrode structure 111, which is to be understood as a structure comprising two or more different materials, as will be described later on in more detail. A gate electrode structure is to be understood as a structure comprising at least an electrode material and a gate dielectric material separating the gate electrode material from the active regions 103A, 103B. For convenience, a detailed configuration of the gate electrode structure 111 may not be shown in FIG. 1a, since a plurality of gate electrode configurations may typically be provided in sophisticated applications. For example, one or more metal-containing electrode materials may be provided in combination with conventional or sophisticated gate dielectric materials, such as high-k materials, which are to be understood as dielectric materials having a dielectric constant of 10.0 and higher. Furthermore, polysilicon material may be provided, possibly in combination with an appropriate cap layer or layer stack, as will also be described later on in more detail. Typically, the gate electrode structure may have a height 111H, which may typically not be appropriate for providing a desired ion blocking capability for introducing a dopant species, such as an N-type dopant species, at a moderately high implantation energy, which would be required to place the dopant species at the desired depth within the active region 103A, that is, at the interface between the active region 103A and the buried insulating layer 102 in FIG. 1a. Furthermore, the gate electrode structure 111 may have a length 111L, which may be defined by the length of a corresponding electrode material. Moreover, a sidewall spacer structure 112 may be formed on the gate electrode structures 111 and may have substantially the same configuration for the transistors 110A, 110B. The spacer structure 112 may, in one illustrative embodiment, be comprised of a single spacer element, possibly in combination with an etch stop liner (not shown), while, in other illustrative embodiments, at least one further offset spacer may be provided, as will be discussed later on in more detail. For example, the sidewall spacer structure 112 may comprise a spacer element formed on the basis of silicon nitride material, possibly in combination with a silicon dioxide etch stop material, while, however, any other appropriate material composition may be used, as long as a desired etch resistivity may be obtained in a further advanced manufacturing stage.

The semiconductor device 100 as illustrated in FIG. 1a may be formed on the basis of the following process techniques. After or prior to defining an appropriate basic doping concentration in the active regions 103A, 103B so as to adjust the overall conductivity type of the transistors 110A, 110B, the isolation structures 103C may be formed by using well-established lithography, etch, deposition and planarization techniques. Thereafter, the gate electrode structure 112 may be formed by using an appropriate manufacturing sequence that may depend on the material composition of the gate electrode structure 112. For example, if polysilicon is to be used, possibly in combination with other materials, a gate dielectric material may be formed first, for instance by oxidation and/or deposition, and thereafter the desired materials may be deposited, for instance by low pressure chemical vapor deposition (CVD), when polysilicon material is considered. If required, further cap materials may be deposited and the resulting layer stack may then be patterned on the basis of sophisticated lithography and etch techniques. Thereafter, the spacer structure 112 may be formed, wherein, if required, any appropriate sequence of material layers may be deposited, for instance on the basis of thermally activated CVD techniques and the like, followed by an anisotropic etch process based on well-established plasma-assisted etch chemistries. During the corresponding manufacturing sequence, a width 112W of the structure 112 may be adjusted so as to obtain the desired offset from the gate electrode structure 111, as may be appropriate for the transistor 110B for forming deep drain and source regions.

Figure 1B:
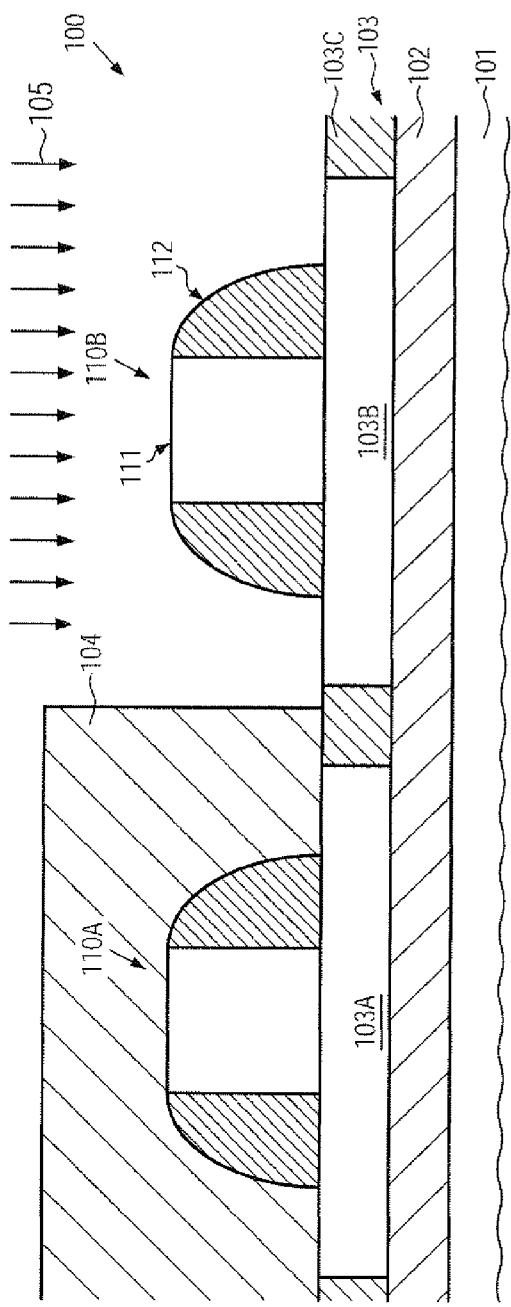
FIGS. 1p-1q schematically illustrate cross-sectional views of the semiconductor device in which a sidewall spacer structure may be provided so as to include an offset spacer for a desired offset of a strain-inducing semiconductor material in combination with an outer spacer for defining the lateral offset of deep drain and source regions of the P-channel transistor and the N-channel transistor, according to still further embodiments.

FIG. 1b schematically illustrates the semiconductor device 100 in a manufacturing stage in which the transistor 110A may be masked by a mask 104, such as a resist mask, while the transistor 110B is exposed to an ion implantation process 105, during which an appropriate dopant species may be introduced into the exposed portion of the active region 103B as may be required for obtaining deep drain and source regions for the transistor 110B. In the embodiment shown, the transistor 110B may represent a P-channel transistor, which may also receive a strain-inducing semiconductor alloy in close proximity to the gate electrode structure 111 so that a corresponding dopant profile of the deep drain and source regions may have a less pronounced effect on the overall transistor performance. Consequently, the implantation parameters of the process 105 may be selected such that undue dopant incorporation into a channel region 113 may be substantially avoided.

Figure 1C:
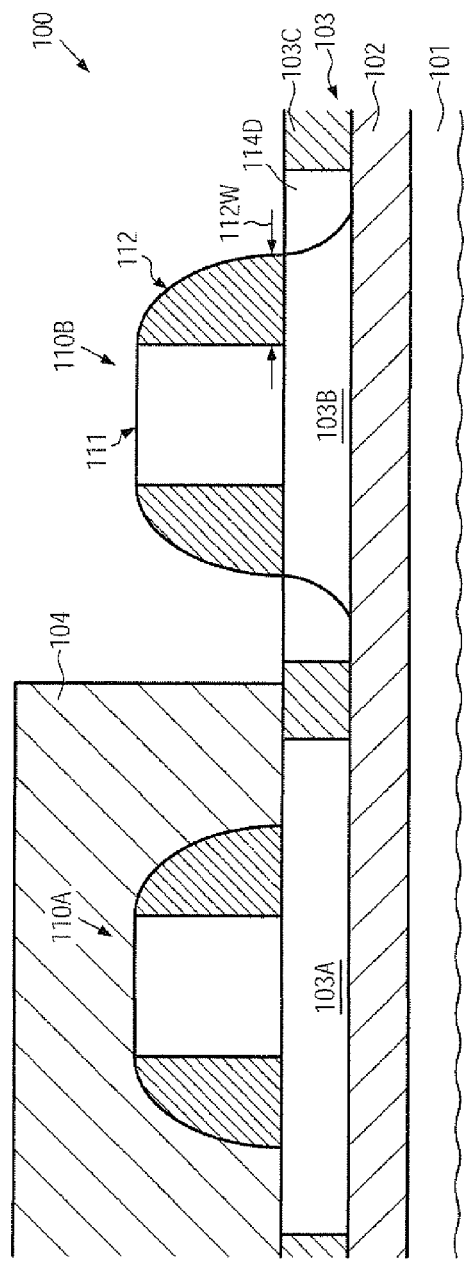

FIG. 1c schematically illustrates the semiconductor device 100 with deep drain and source regions 114D, a lateral offset of which from the gate electrode structure 111 may be substantially determined by the width 112W. It should be appreciated that, in one illustrative embodiment, the mask 104 may still be present and be used as an etch mask during the further processing of the device 100.

Figure 1D:
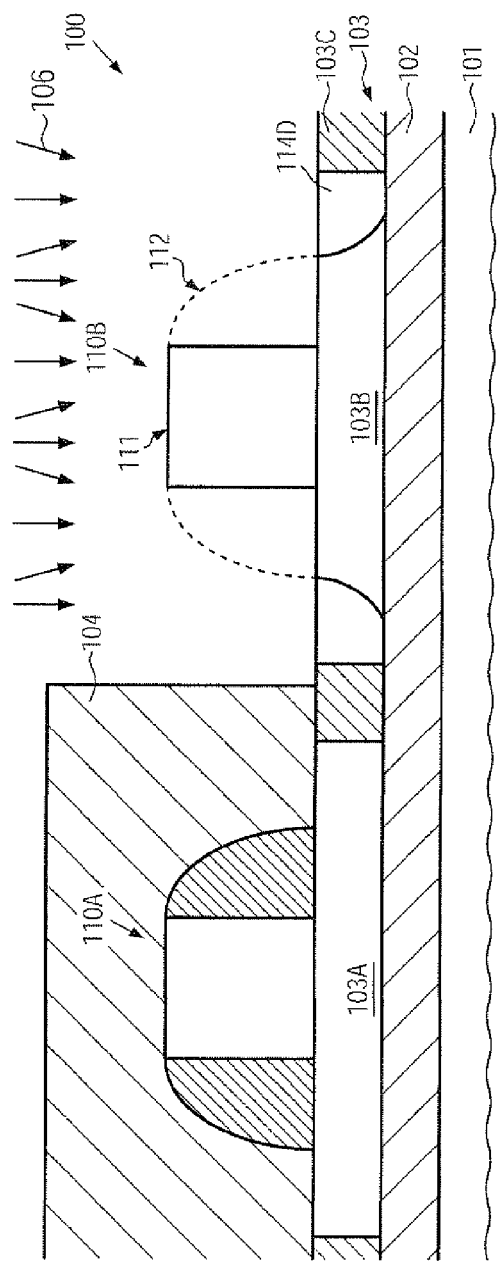

FIG. 1d schematically illustrates the semiconductor device 100 when exposed to an etch ambient 106, which may be appropriately established to enable the removal of material of the spacer structure 112 of the transistor 110B. In one illustrative embodiment, the etch ambient 106 may be established on the basis of a wet chemical etch recipe, which may provide a high degree of selectivity with respect to material of the active region 103B. For example, hot phosphoric acid may be efficiently used as an agent, when at least a portion of the spacer structure 112 is comprised of silicon nitride material. As previously explained, the spacer structure 112 may be comprised of two or more materials, which may provide the high etch resistivity during the process 106, so as to maintain a desired portion thereof, as will be explained later on in more detail. In the illustrative embodiment shown in FIG. 1d, the spacer structure 112 may be removed when exposure of a corresponding electrode material of the gate electrode structure 111 may be considered appropriate. In other cases, respective sidewall portions of an electrode material may have formed thereon a thin protection layer, which may provide the integrity of the corresponding electrode material and/or any other materials provided in the gate electrode structure 111, such as a high-k dielectric material and the like. Thus, during the etch process 106, the mask 104 may be efficiently used as an etch mask, thereby avoiding any additional lithography steps.

FIG. 1e schematically illustrates the semiconductor device 100 after removal of the etch mask 104 of FIG. 1d. Thereafter, the desired offset from the gate electrode structure 111 of the transistor 110B may be defined for a subsequent cavity etch process when removal of material of the spacer structure 112 may result in an inappropriate performance during the further processing. In this case, an additional offset spacer may be formed by depositing an appropriate material layer, such as a silicon nitride material and patterning the same.

FIG. 1f schematically illustrates the semiconductor device 100 with offset spacers 112A formed on the gate electrode structure 111 of the transistor 110B, while the corresponding offset spacer 112A is formed on the spacer structure 112 in the transistor 110A.

The offset spacers 112A may be comprised of silicon nitride or any other appropriate material which may have the desired etch resistivity during the further processing of the device 100. For example, a silicon nitride material may be deposited on the basis of a thermally activated CVD process to provide a desired high material density and controllability of the deposition rate, thereby obtaining a desired layer thickness, which may then result in a corresponding width 112O in accordance with device requirements of the transistor 110B. For example, the width 112O of the spacers 112A may be in the range of approximately one nanometer to several nanometers, such as 5 nm and the like, depending on the technology standard under consideration.

FIG. 1g schematically illustrates the semiconductor device 100 when exposed to a further etch ambient 107, which may be established on the basis of well-established plasma-assisted etch chemistries for removing material of the active regions 103A, 103B selectively to the gate electrode structure 111 and the spacer structure 112 and the offset spacer 112A. For example, an etch chemistry on the basis of fluorine and/or chlorine may be used, which may exhibit a high degree of selectivity with respect to silicon nitride material, silicon dioxide material and the like. It should be appreciated that the gate electrode structures 111 may comprise an appropriate cap layer, if exposure to the etch ambient 107 is considered inappropriate. For example, an appropriate cap layer may be provided, as will be described later on in more detail. In other cases, the corresponding electrode material may itself provide the desired etch selectivity. During the etch process 107, first cavities 120A may be formed in the active region 103A, wherein an offset thereof from the gate electrode structure 111 may be defined by the width of the spacer structure 112 in combination with the offset spacer 112A. On the other hand, second cavities 120B may be formed in the active region 103B, wherein an offset thereof may be defined by the spacer 112A.

FIG. 1h schematically illustrates the semiconductor device 100 in a further advanced manufacturing stage in which an implantation mask 108, such as a resist mask, may be formed so as to cover the second transistor 110B and expose the first transistor 110A to an implantation process 109, in which process parameters are appropriately selected so as to form deep drain and source regions of the transistor 110A. Hence, the implantation species may be incorporated into the exposed portion of the active region 103A through the cavities 120A, thereby reducing the effective thickness of the exposed portion of the active region 103A. Thus, as previously explained, reduced implantation energies may be applied so that the ion blocking capability of the gate electrode structure 111 and the spacer structure 112 may be sufficient to reliably prevent penetration of implantation species, at least into a channel region 113 of the transistor 110A.

FIG. 1i schematically illustrates the semiconductor device 100 after the removal of the implantation mask 108 of FIG. 1h. Thus, deep drain and source regions 114D of the transistor 110A are formed at the periphery of the active region 103A and may extend down to the buried insulating layer 102 without unduly compromising integrity of the channel region 113, as previously explained.

FIG. 1j schematically illustrates the semiconductor device 100 in a further advanced manufacturing stage in which an implantation mask, such as a resist mask 121, may cover the transistor 110A while exposing the transistor 110B. Furthermore, an ion implantation sequence 122 may be performed to introduce appropriate dopant species for forming drain and source extension regions 114E of the transistor 110B. Furthermore, the sequence 122 may further comprise an implantation step for introducing a dopant species of opposite conductivity type compared to the species implanted for forming extension regions 114E so as to provide appropriate counter-doped or halo regions 114C. It should be appreciated that the implantation process 122 may be performed, at least in one of the implantation steps, on the basis of a tilt angle, depending on the complexity of the required dopant profile. Furthermore, the process parameters of the sequence 122 may have to be adapted to the configuration provided by the cavities 120B, which may typically require reduced implantation energies. An appropriate set of implantation parameters may readily be established by simulation, experiment and the like. After the implantation process 122, the implantation mask 121 may be removed and the device 100 may be prepared for a subsequent epitaxial growth process by, for instance, performing respective wet chemical cleaning processes and the like.

FIG. 1k schematically illustrates the semiconductor device 100 when exposed to a deposition ambient 123 during which a strain-inducing semiconductor material, such as a silicon/germanium alloy, a silicon/germanium/tin alloy, a silicon/tin alloy and the like, may be formed in the cavities 120A, 120B, thereby obtaining respective portions 124A, 124B of the semiconductor alloy. During the deposition process 123, the offset spacer 112A may act as a growth mask while an appropriate cap material of the gate electrode structure 111 may provide the suppression of significant material deposition, if deemed inappropriate for the structure 111. As previously explained, the material 124B having the reduced offset from the gate electrode structure 111 may induce a desired high strain component 113B in the adjacent channel region 113. On the other hand, the material portion 124A may induce a significantly reduced degree of strain 113A in the channel region 113 of the transistor 110A due to a significantly greater offset.

FIG. 1*l* schematically illustrates the semiconductor device 100 in a further advanced manufacturing stage in which a further implantation mask 124, such as a resist mask, may be provided to cover the transistor 110B while exposing the transistor 110A. Furthermore, in one illustrative embodiment, an implantation process 125 may be performed on the basis of an appropriate implantation species which may, in combination with appropriately set process parameters, result in a significant reduction of the inherent strain of the portion 124A, thereby also significantly reducing any strain created in the channel region 113 of the transistor 110A. For example, the implantation process 125 may be performed on the basis of a silicon species, a germanium species, a xenon species and the like so as to substantially amorphize the material 124A. For this purpose, appropriate implantation energy and dose values may be selected, which may be accomplished on the basis of simulation, experiments and the like. It should be appreciated that, in other illustrative embodiments, the implantation process 125 may be omitted if the corresponding reduced strain component 113A (FIG. 1*k*) is considered irrelevant for the overall characteristics of the transistor 110A. In this case, enhanced efficiency of the entire manufacturing flow may be accomplished.

FIG. 1*m* schematically illustrates the semiconductor device 100 when subjected to an etch process 126 performed on the basis of the mask 124. The etch process 126 may be performed on the basis of any appropriate etch chemistry, such as a wet chemical etch recipe and the like, which may have the desired etch selectivity with respect to the active region 103A so that a removal of the spacer structure 112 and of the offset spacer 112A may be achieved. For example, the etch process 126 may be performed on the basis of hot phosphoric acid when the spacers 112A, 112 are substantially comprised of silicon nitride.

FIG. 1*n* schematically illustrates the semiconductor device 100 when subjected to an implantation sequence 127, which may be performed on the basis of an implantation species for forming drain and source extension regions 114E, possibly in combination with corresponding counter-doped regions 114C, thereby obtaining drain and source regions 114, which may thus be comprised of the extension regions 114E and the deep regions 114D in combination with the counter-doped regions 114C. For this purpose, any appropriate process parameters may be used, for instance in terms of implantation energy, dose, tilt angle and the like. It should be appreciated that, in other illustrative embodiments, the ion implantation process 125 (FIG. 1*l*) may be performed as a step of the sequence 127, thereby also providing a certain degree of amorphization, which may be advantageous in view of enhancing process conditions for forming the regions 114E, 114C. In other cases, a corresponding enhanced degree of amorphization may be advantageous during a subsequent anneal process, thereby even further enhancing the overall crystalline quality and also enhance the effect of strain relaxation of the portion 124A. It should be appreciated that the strain inducing materials 124A, 124B may be provided with a certain degree of intrinsic doping, for instance with a certain degree of P-doping, to enhance overall conductivity of the drain and source regions 114 of the transistor 110B. In this case, the material 124A may comprise a certain degree of counter-doping in the transistor 110A which, however, may not substantially negatively influence the overall transistor characteristics due to the implantation process 127 and due to the fact that contact areas may still be formed, which may contact the transistor 110A within the area of the extension region 114E. In other illustrative embodiments, the material 124A, 124B may be provided as a substantially non-doped semiconductor alloy and additional dopant species may be introduced selectively in the transistor 110B, if desired, by performing an additional implantation step while masking the transistor 110A. In other illustrative embodiments (not shown), the drain and source extension regions may be formed after providing the material 124B while, if desired, the counter-doped regions 114C may be provided during the implantation process, as previously described with reference to FIG. 1*j*.

Figure 1O:
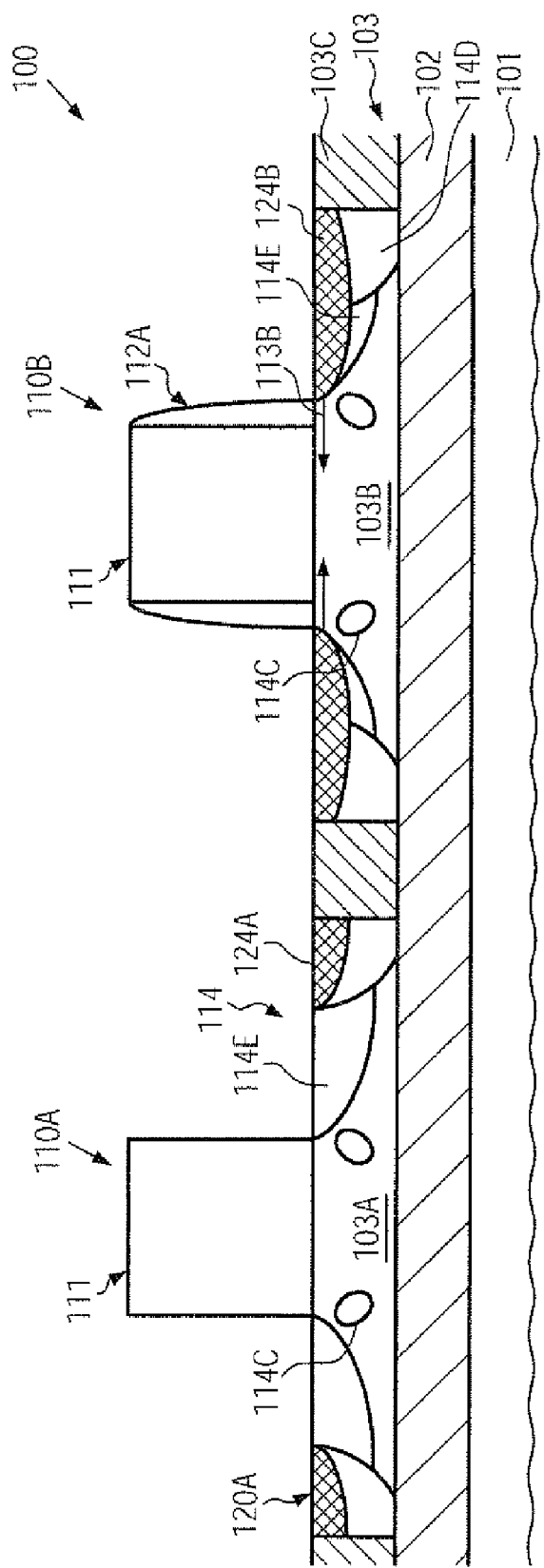

FIG. 1*o* schematically illustrates the semiconductor device 100 after the removal of the mask 124 of FIG. 1*n*. Thus, the transistors 110A, 110B may comprise the drain and source regions 114 having an appropriate configuration, i.e., the deep drain and source regions 114D of the transistor 110A may extend down to a desired depth, i.e., in the embodiment shown, the regions 114D may extend down to the buried insulating layer 102, while the drain and source regions 114 of the transistor 110B may comprise a significant amount of strain-inducing material, i.e., the portion 124B, which may provide a high strain component 113B. On the other hand, the semiconductor alloy 124A in the transistor 110A may be in a substantially relaxed state or the corresponding internal strain may be less efficient due to increased offset from the gate electrode structure 111. Furthermore, as previously described, in one illustrative embodiment, extension regions 114E and the halo region 114C of the transistor 110B may be formed prior to depositing the materials 124A, 124B, thereby eliminating any influence of deposition-related non-uniformities on the dopant profile of the transistor 110B. That is, any thickness variation of the materials 124A, 124B, which may be introduced by deposition-related fluctuations, may not be translated into corresponding dopant profile variations. In other illustrative embodiments, the extension regions 114E may be formed after the deposition of the materials 124A, 124B, which may be acceptable since the patterning sequence for forming the cavities and also the subsequent deposition process for filling in the materials 124A, 124B may be performed on the basis of enhanced process uniformity due to the reduction of any pattern loading effects, which may be understood as removal rate variations or deposition rate variations caused by a difference in density of device features in a local manner.

Although in FIG. 1*o* the transistor 110B is illustrated so as to still have the offset spacer 112A, in other illustrative embodiments, the spacer 112A may be removed on the basis of an additional etch step, while, in other cases, the spacer 112A may have been removed in an earlier manufacturing stage, for instance, by omitting the amorphization implantation process 125 (FIG. 1*l*) so that the corresponding mask 124 (FIG. 1*n*) may not be required and the spacer structure 112, 112A of the transistor 110A (FIG. 1*m*) may be removed together with the spacer 112A of the transistor 110B during the process 126 (FIG. 1*m*).

The further processing may be continued by performing any appropriate anneal processes to activate dopants and recrystallize implantation-induced damage, wherein corresponding process parameters may be selected such that a desired lateral dopant profile may be obtained, while a further diffusion of dopant species in the depth direction may not be required.

Figure 1P:
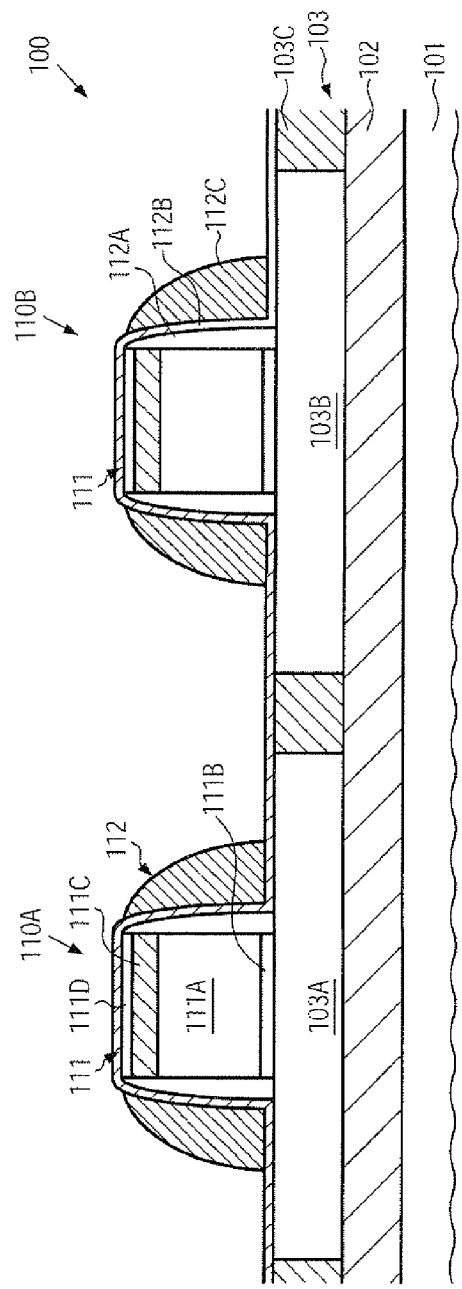
Figure 1Q:
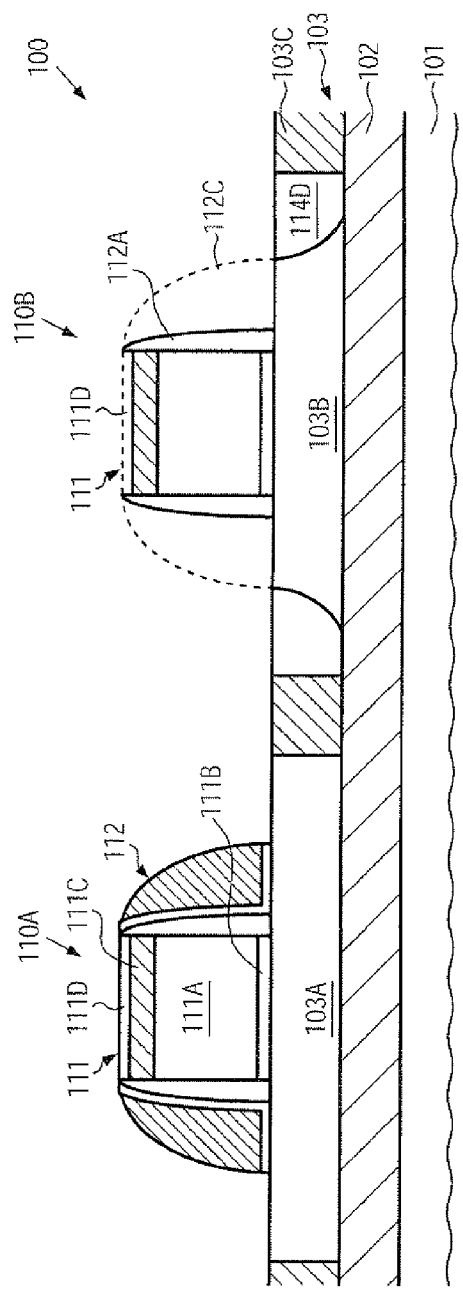

With reference to FIGS. 1p and 1q, further illustrative embodiments will now be described in which an offset spacer may be provided in an early manufacturing stage.

FIG. 1p schematically illustrates the semiconductor device 100 comprising the gate electrode structure 111 and the spacer structure 112. As illustrated, the gate electrode structure 111 may comprise a gate electrode material 111A, such as polysilicon, possibly in combination with one or more metal-containing electrode materials, if sophisticated gate electrode structures are considered. Furthermore, a gate insulation layer 111B separates the electrode material 111A from the active region 103A, 103B, respectively. The gate insulation layer 111B may comprise "conventional" dielectric materials, such as silicon dioxide and the like, and/or high-k dielectric materials, as previously explained. It should further be appreciated that the gate electrode material 111A may have a different composition in the transistors 110A, 110B, depending on corresponding characteristics, such as work function of specific electrode materials and the like. Furthermore, when exposure of the electrode material 111A during the further processing is considered inappropriate, the gate electrode structure 111 may comprise one or more cap materials, such as materials 111C, 111D, which may be provided in the form of silicon nitride, silicon dioxide and the like. For example, the material layer 111C may represent a silicon nitride material, while the layer 111D may be comprised of silicon dioxide. It should be appreciated, however, that a single material layer may be provided or more than two layers may be formed, if considered appropriate. Furthermore, any other appropriate material composition may be applied, depending on the overall process and device requirements. Moreover, the spacer structure 111 may comprise the offset spacer element 112A, which in the embodiment shown may be in contact with the electrode material 111A and also with the gate insulation layer 111B, thereby providing a high degree of integrity of these materials. For example, high-k gate dielectric materials may suffer from increased material erosion when exposed to wet chemical etch ambients, which may frequently be used for cleaning processes, resist mask removal and the like. In other illustrative embodiments, an etch stop liner (not shown) may be formed on sidewalls of the electrode material 111A followed by the offset spacer 112A. Furthermore, the spacer structure 112A may comprise at least one further spacer element, referred to as outer spacer 112C, which in combination with an etch stop liner 112B may be formed on the offset spacer 112A.

The semiconductor device 100 as shown in FIG. 1p may be formed on the basis of the following processes. After forming the material layer for the gate insulation layer 111B, the electrode material 111A may be deposited, followed by the one or more cap materials 111C, 111D. Thereafter, a corresponding patterning process may be performed, followed by the deposition of a spacer material, which may then be patterned into the offset spacer 112A. For instance, a thermally activated CVD process may be used, as previously explained. Next, the etch stop liner 112B may be formed, for instance by deposition, followed by the deposition of a spacer material, which may then be etched into the outer spacer element 112C on the basis of well-established etch strategies. Thereafter, the further processing may be continued as further described, for instance with reference to FIG. 1b, i.e., deep drain and source regions may be formed in the transistor 110B.

FIG. 1q schematically illustrates the semiconductor device 100 in a further advanced manufacturing stage. As illustrated, the deep drain and source regions 114D may be formed in the transistor 110B with a lateral offset defined by the spacer structure 112. Furthermore, the outer spacer 112C may be removed, which may be accomplished by covering the transistor 110A and exposing the device 100 to an appropriate etch ambient, as previously explained. For example, the outer spacer element 112C may be removed on the basis of hot phosphoric acid. During the corresponding etch process, the layer 111D may preserve integrity of the cap layer 111C. Thereafter, the corresponding etch mask may be removed and the device 100 may be subjected to an etch process for forming cavities, as previously described. During the corresponding etch process and the subsequent epitaxial deposition of the strain-inducing semiconductor alloy, the cap layers 111C may preserve integrity of the electrode materials 111A. Thereafter, the further processing may be continued, as previously described, in order to complete the basic transistor configuration. Consequently, in the entire procedure for forming drain and source regions, which may require various masking steps, integrity of the gate electrode material 111A and of the gate insulation layer 111B may be maintained by the offset spacer 112A.

As a result, the present disclosure provides semiconductor devices and techniques in which superior transistor performance may be obtained by forming a strain-inducing semiconductor alloy in close proximity to a channel region of a P-channel transistor on the basis of appropriately positioned cavities, while at the same time cavities of significantly increased offset may be formed in the N-channel transistor, through which deep drain and source regions may be implanted. Thus, the cavity etch and the epitaxial growth process for forming strain-inducing material after forming the deep drain and source regions of the N-channel transistor may be commonly performed for both types of transistor, thereby enhancing overall process efficiency and uniformity. Moreover, if desired, an internal strain of the semiconductor alloy in the N-channel transistor may be relaxed, thereby avoiding any compressive strain component in the N-channel transistor while the presence of the semiconductor alloy may provide superior conductivity due to the different electronic characteristics of, for instance, a silicon/germanium material compared to a silicon material. Consequently, a reduced gate height, which may be desirable in view of reducing fringing capacitance and/or surface topography after gate patterning, may be applied without negatively affecting the dopant profile in the N-channel transistors. Consequently, further manufacturing processes, such as the deposition of an interlayer dielectric material above the basic transistor structure, may be accomplished on the basis of a less critical device geometry, thereby enhancing the efficiency of, for instance, strain-inducing mechanisms using highly stressed dielectric materials and/or the patterning of a contact structure in densely packed device regions and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    masking a first semiconductor region of a first transistor having formed thereon a first gate electrode structure comprising a first sidewall spacer structure, while exposing a second semiconductor region of a second transistor having formed thereon a second gate electrode structure comprising a second sidewall spacer structure;
    forming deep drain and source regions in said second semiconductor region by using said second gate electrode structure as an implantation mask;
    removing at least a portion of said second sidewall spacer structure;
    forming first cavities in said first semiconductor region on the basis of said first sidewall spacer structure;
    forming second cavities in said second semiconductor region after removing at least said portion of said second sidewall spacer structure, wherein forming said second cavities is performed by the same process as forming said first cavities;
    forming deep drain and source regions in said first cavities;
    forming drain and source extension regions in said second semiconductor region; and
    forming a strain-inducing semiconductor material in said first and second cavities.

2. The method of claim 1, further comprising forming an offset spacer element on sidewalls of said first and second gate electrode structures so as to define a lateral offset of said second cavities from a gate electrode material of said second gate electrode structure.

3. The method of claim 1, further comprising forming said first and second sidewall spacer structures by forming an offset spacer and at least one outer spacer.

4. A method, comprising:
    forming a first and second sidewall spacer structures by forming an offset spacer and at least one outer spacer;
    masking a first semiconductor region of a first transistor having formed thereon a first gate electrode structure comprising said first sidewall spacer structure, while exposing a second semiconductor region of a second transistor having formed thereon a second gate electrode structure comprising said second sidewall spacer structure;
    forming deep drain and source regions in said second semiconductor region by using said second gate electrode structure as an implantation mask;
    removing at least a portion of said second sidewall spacer structure, wherein removing at least a portion of said second sidewall spacer structure comprises removing said at least one outer spacer of said second sidewall spacer structure;
    forming first cavities in said first semiconductor region on the basis of said first sidewall spacer structure;
    forming second cavities in said second semiconductor region after removing at least said portion of said second sidewall spacer structure, wherein forming said second cavities is performed by the same process as forming said first cavities;
    forming deep drain and source regions in said first cavities;
    forming drain and source extension regions in said second semiconductor region; and
    forming a strain-inducing semiconductor material in said first and second cavities.

5. The method of claim 1, further comprising relaxing a strain of said strain-inducing material selectively in said first semiconductor region.

6. A method, comprising:
    masking a first semiconductor region of a first transistor having formed thereon a first gate electrode structure comprising a first sidewall spacer structure, while exposing a second semiconductor region of a second transistor having formed thereon a second gate electrode structure comprising a second sidewall spacer structure;
    forming deep drain and source regions in said second semiconductor region by using said second gate electrode structure as an implantation mask;
    removing at least a portion of said second sidewall spacer structure;
    forming first cavities in said first semiconductor region on the basis of said first sidewall spacer structure;
    forming second cavities in said second semiconductor region after removing at least said portion of said second sidewall spacer structure;
    forming deep drain and source regions in said first cavities;
    forming drain and source extension regions in said second semiconductor region;
    forming a strain-inducing semiconductor material in said first and second cavities;
    relaxing a strain of said strain-inducing material selectively in said first semiconductor region; and
    forming a mask so as to expose said first semiconductor region having formed thereon said first gate electrode structure and to cover said second semiconductor region, wherein relaxing said strain-inducing material and removing at least said portion of said first sidewall spacer structure are performed on the basis of said mask.

7. The method of claim 6, wherein strain in said strain-inducing material is relaxed prior to removing said at least a portion of said first sidewall spacer structure.

8. A method, comprising:
    masking a first semiconductor region of a first transistor having formed thereon a first gate electrode structure comprising a first sidewall spacer structure, while exposing a second semiconductor region of a second transistor having formed thereon a second gate electrode structure comprising a second sidewall spacer structure;
    forming deep drain and source regions in said second semiconductor region by using said second gate electrode structure as an implantation mask;
    removing at least a portion of said second sidewall spacer structure;
    forming first cavities in said first semiconductor region on the basis of said first sidewall spacer structure;
    forming second cavities in said second semiconductor region after removing at least said portion of said second sidewall spacer structure;
    forming deep drain and source regions in said first cavities;
    forming drain and source extension regions in said second semiconductor region;
    forming a strain-inducing semiconductor material in said first and second cavities; and
    relaxing a strain of said strain-inducing material selectively in said first semiconductor region, wherein strain in said strain-inducing material is relaxed after removing said at least a portion of said first sidewall spacer structure.

9. The method of claim 5, further comprising forming metal silicide regions in said first semiconductor region on the basis of said relaxed strain-inducing semiconductor material.

10. The method of claim 5, further comprising forming metal silicide regions in said first semiconductor region when said strain-inducing semiconductor material is in a non-relaxed state.

11. The method of claim 1, further comprising removing at least a portion of said first sidewall spacer structure and forming drain and source extension regions of said first transistor.

12. The method of claim 1, wherein said first transistor represents an N-channel transistor and said second transistor represents a P-channel transistor.

13. A method, comprising:
forming first cavities in a first semiconductor region of a first transistor on the basis of a first sidewall spacer structure and second cavities in a second semiconductor region of a second transistor on the basis of a second sidewall spacer structure, said second semiconductor region comprising deep drain and source regions of said second transistor;
forming deep drain and source regions of said first transistor through said first cavities;
forming a strain-inducing semiconductor material in said first and second cavities;
forming drain and source extension regions of said first transistor;
forming drain and source extension regions of said second transistor; and
reducing a strain-inducing effect of said strain-inducing semiconductor material selectively in said first transistor after removing at least a portion of said first sidewall spacer structure.

14. The method of claim 13, wherein said drain and source extension regions of said second transistor are formed through said second cavities.

15. The method of claim 13, wherein said drain and extension regions of said first transistor are formed after forming said semiconductor material.

16. The method of claim 13, wherein forming said first and second cavities comprises forming said first cavities so as to have a first offset to a gate electrode material of said first transistor and forming said second cavities so as to have a second offset from a gate electrode material of said second transistor and wherein said second offset is less than said first offset.

17. The method of claim 13, further comprising forming a spacer structure on sidewalls of a gate electrode structure of said first and second transistors and forming said deep drain and source regions of said second transistor on the basis of said spacer structure.

18. The method of claim 17, further comprising at least removing a portion of said spacer structure selectively in said second transistor prior to forming said first and second cavities.

19. The method of claim 13, wherein said first transistor is an N-channel transistor and said second transistor is a P-channel transistor.

* * * * *